(12) United States Patent
Scherr et al.

(10) Patent No.: US 9,064,557 B2
(45) Date of Patent: Jun. 23, 2015

(54) SYSTEMS AND METHODS FOR NON-VOLATILE MEMORY

(71) Applicant: Infineon Technologies AG, Neubiberg (DE)

(72) Inventors: Wolfgang Scherr, Villach/Landskron (AT); Michael Sorger, Villach (AT); Guenther Wellenzohn, Villach (AT); Magdalena Forster, Villach (AT); Philemon Schweizer, Feffernitz (AT); Katharina Schmut, Villach (AT); Bernhard Goller, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/085,991

(22) Filed: Nov. 21, 2013

(65) Prior Publication Data

US 2015/0138906 A1    May 21, 2015

(51) Int. Cl.
   *G11C 7/00*    (2006.01)
   *G11C 5/14*    (2006.01)
(52) U.S. Cl.
   CPC ...................... *G11C 5/141* (2013.01)

(58) Field of Classification Search
   CPC .................................. G11C 5/14; G11C 5/147
   USPC .................................................. 365/226, 229
   See application file for complete search history.

(56) References Cited

U.S. PATENT DOCUMENTS

| | | | |
|---|---|---|---|
| 4,701,858 A * | 10/1987 | Stokes et al. | 702/58 |
| 7,003,620 B2 * | 2/2006 | Avraham et al. | 711/103 |
| 7,369,969 B2 | 5/2008 | Scherr | |
| 7,787,339 B2 * | 8/2010 | Terasaki | 369/53.18 |
| 8,200,885 B2 * | 6/2012 | Sartore | 711/100 |
| 8,275,930 B2 * | 9/2012 | Inoue et al. | 711/103 |

* cited by examiner

*Primary Examiner* — Michael Tran
(74) *Attorney, Agent, or Firm* — Eschweiler & Associates, LLC (57) ABSTRACT

A self powered memory system is disclosed. The system includes a volatile supply component, a battery component, a switch component, and a volatile memory component. The volatile supply component is configured to provide a time varying supply. The battery component is configured to generate a non-volatile supply. The switch component is configured to generate a persistent supply from the time varying supply and the non-volatile supply. The volatile memory component is configured to maintain data by using the persistent supply.

20 Claims, 6 Drawing Sheets

| COPPER - CATHODE |
| :---: |
| 308 |
| 306 |
| SILICON - ANODE |
| 304 |
| 302 |

SYSTEMS AND METHODS FOR NON-VOLATILE MEMORY

BACKGROUND

Electronic devices of today typically require memory in order to operate. There are two types of memory available. Volatile or dynamic memory and non-volatile or static memory. Volatile memory needs power, such as refresh cycles, in order to maintain the data stored therein. Volatile memory is typically faster and cheaper than non-volatile memory. Data is written to volatile memory cells using program or write operations and ready from volatile memory cells using read operations. However, when power is lost, so is the data.

Non-volatile memory also uses power to operate, but can maintain data without power. Data is written to non-volatile memory by applying relatively large voltages that alter a state of memory cells of the memory. The relatively large voltages are destructive and limit the number of write cycles such memories are able to perform. Further, read operations tend to be slower.

The type of memory used by electronic devices generally depends on device requirements. For example, if data needs to be maintained without power, non-volatile memory is usually utilized. If not, then volatile memory is used.

DETAILED DESCRIPTION

The present invention will now be described with reference to the attached drawing figures, wherein like reference numerals are used to refer to like elements throughout, and wherein the illustrated structures and devices are not necessarily drawn to scale.

Systems and methods are disclosed that facilitate systems and methods utilizing static or non-volatile memory. A self powered memory system with an on chip battery is provided, which permits static memory behavior while using dynamic/volatile memory.

Figure 1:
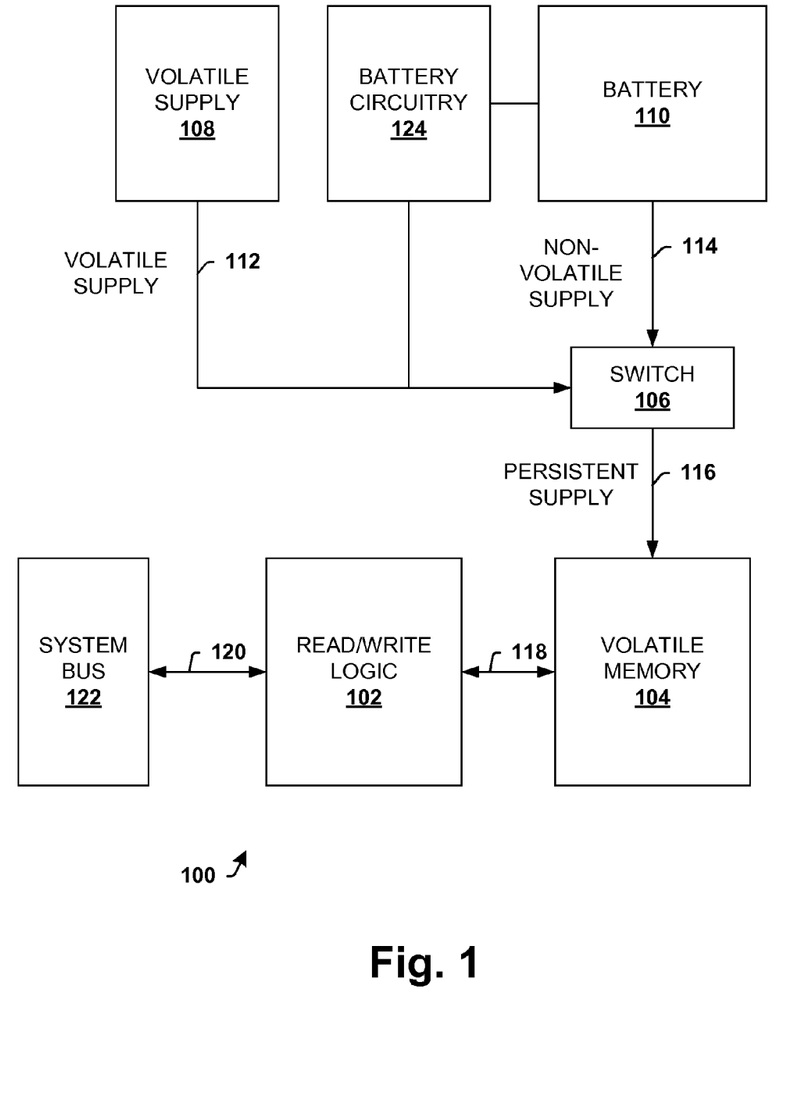
FIG. 1 is a block diagram illustrating a self powered memory system 100 that utilizes a non-volatile power in addition to a volatile power in order to maintain data.

FIG. 1 is a block diagram illustrating a self powered memory system 100 that utilizes a non-volatile power in addition to a volatile power in order to maintain data. The system 100 utilizes the non-volatile power for when the main or volatile power is unavailable. As a result, a persistent power can be provided to a volatile memory. As a result, the contents or data within the memory are maintained even if the main or volatile power is not present.

The system 100 includes read write logic 102, a volatile memory 104, a switch component 106, a volatile or main supply component 108, and a battery component 110. A system bus 122, as an example, transfers data with the system 100.

The volatile memory 104 is a type of memory that can lose data integrity of stored data when power is not supplied. The volatile memory 104 can include, for example, dynamic random access memory (DRAM), random access memory (RAM), static random access memory (SRAM) and the like. In one example, the volatile memory 104 includes 6 transistor SRAM structures based on feedback CMOS inverter structures (2×2 transistors).

Generally, non-volatile memory has some deficiencies when compared with volatile memory, such as the memory 104. Non-volatile memory requires special, relatively high voltages for write operations. For example, non-volatile memory is typically programmed or written by applying relatively large voltages to the cells to be written to. These large voltages are destructive and degrade the cells each time they are applied. After a number of cycles, the non-volatile cells degrade to the point of not functioning properly or reliably. For example, non-volatile cells may be limited to less than 1,000 write cycles. Further, non-volatile memory is relatively slow when compared with volatile memory in terms of access time, program/write times, and read times. The non-volatile memory requires the special voltages and more complex read/write logic to implement. As a result, the memory operations (access times, read times, program times) generally take longer to perform. As a result, systems using them may have to wait on the slower memory operations. Furthermore, the non-volatile memories require larger and more complicated structures to implement and, thus require larger die than volatile memories. Non-volatile memories require specific technologies, such as tunnel oxides in order to minimize programming voltage and charge pumps to allow on chip programming. Reading is challenging due to electrical level differences and field strengths used for writing.

The volatile memory 104 provides relatively faster memory operations, require less die or area due to lower complexity, and have longer lifetimes in terms of write cycles. The volatile memory 104 utilizes lower voltages (not special voltages), which avoids using high voltage power circuits. Further, the memory operations, including read and write/program occur faster in part due to the lower voltages utilized. The lifetimes can exceed 100,000 write cycles.

Generally, volatile memory doesn't maintain data without power. The volatile memory 104 has a persistent supply 116 of power so that it maintains the stored data.

A volatile or main supply component 108 generates a volatile supply 112. The volatile supply 112 is a time varying supply that can be OFF and/or at power levels below threshold values for components to stay operational of the system 100. The threshold values include values for which the volatile memory 104 would not properly maintain data without an additional source of power. The volatile component is a typical power source utilized in electronics. The supply component 108 is off when a larger system is off. For example, in an automotive system, the volatile component 108 would not provide power when the auto is off. The volatile supply component 108 provides supply power to one or more components, including circuits, logic, sensors, controllers, and the like. To aid understanding, the volatile supply 112 is shown provided to the switch component 106, however it is appreciated the volatile supply 112 can be provided to other components.

The battery component 110 provides a non-volatile power 114. The non-volatile power 114 is generally always available for use. The battery component 110 includes a persistent power source, such as a battery, capacitor, or some other item capable of storing power. The battery component 110 includes non-chargeable types (primary) and rechargeable types (secondary). In one example, the battery component 110 includes a silicon based battery. Further, the battery component 110 may include voltage regulation, in one example, to provide its power output at a selected voltage or range of voltages. The battery component 110 is typically formed on the same die or chip as the volatile memory 104, the read/write logic 102, and the like.

The switch component 106 receives the volatile supply 112 and the non-volatile supply 114 and provides the persistent supply 116 to the volatile memory 104. In one example, the switch component 106 utilizes the volatile memory 112 unless it isn't available. The non-volatile supply 114 is used when the volatile supply 112 is not available. In another example, the switch component 106 provides the non-volatile supply 114 on the volatile supply 112 having a voltage below a threshold value.

In one example, the switch component 106 includes diodes connected with the volatile supply 108 and the battery component 110. The diodes prevent current or power from flowing to the battery component 110. In another example, the switch component 106 includes passive or active semiconductor elements instead of diodes. The semiconductor elements, such as bipolar transistors, junction-FET or MOS-transistors, provide additional active control of current flow. Active control includes for example protective switch-off functions in case of system fails overloading the battery component 110 or for system control and diagnostic purposes.

The system 100 can optionally include battery circuitry 124 coupled to the volatile supply 108 and the battery 110. The battery circuitry 124 is configured to monitor the battery component 110 and charge the battery component 110 on its remaining capacity falling below a threshold value or some other trigger.

The read/write logic 102 interacts with the volatile memory to perform memory operations 118, including read operations and write operations. The read/write logic 102 utilizes lower voltages and complexity than logic utilized for performing memory operations on conventional non-volatile memory systems.

The system bus 122 is configured to transfer data 120 with the read/write logic 102 of the system 100 and other components. Thus, data 120 can be provided from the bus 122 to the logic for writing and to the bus 122 from the logic 102 from read operations. The data 120 can be transferred with other components (not shown) using the system bus 122. For example, the data 120 can be used in control systems, automotive electronic systems, and the like.

It is appreciated that suitable variations of the system 100 are contemplated.

Figure 2:
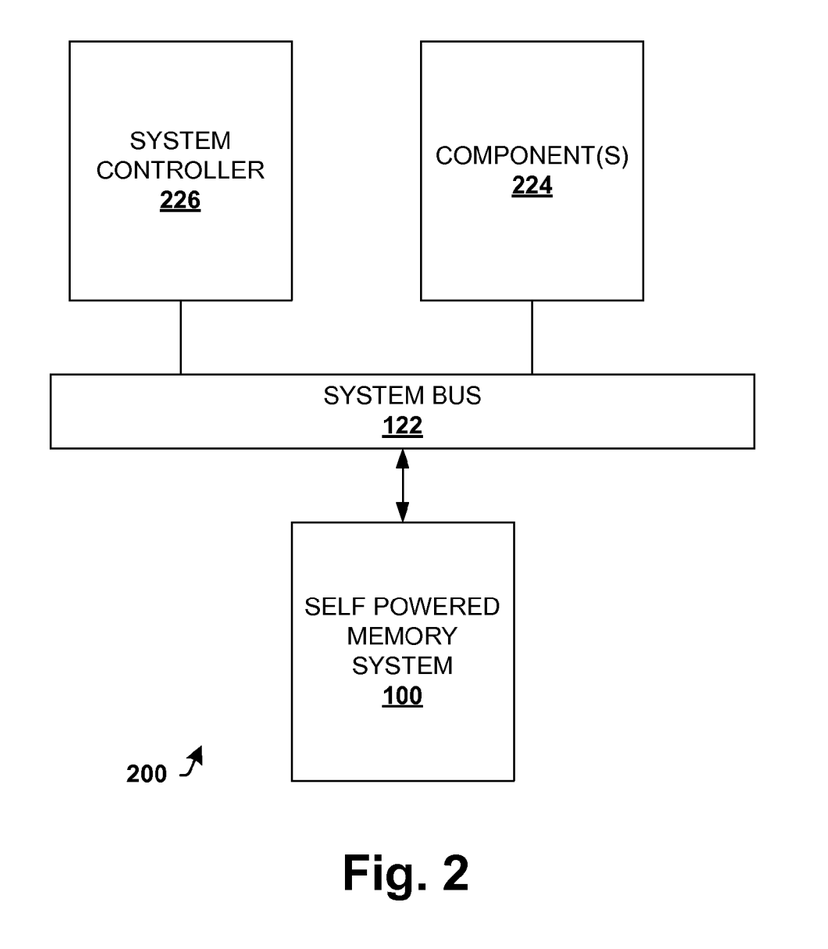
FIG. 2 is a block diagram illustrating a system using a self powered memory.

FIG. 2 is a block diagram illustrating a system 200 using a self powered memory. The system 200 is provided as an example to illustrate use of self powered memory within a system. However, it is appreciated that other systems and variations of the system 200 can also use self powered memory.

The system 200 includes a self powered memory system 100, a system bus 122, a system controller 226 and one or more components 224. The self powered memory system 100 and the system bus are described above. The system 200 includes use for automotive applications and the like.

The system controller 226 controls operation of the system 200. The components 224 can include sensors, control mechanisms, and the like. The system 200 requires persistent data and utilizes the self powered memory system 100 to maintain that data.

Figure 3:
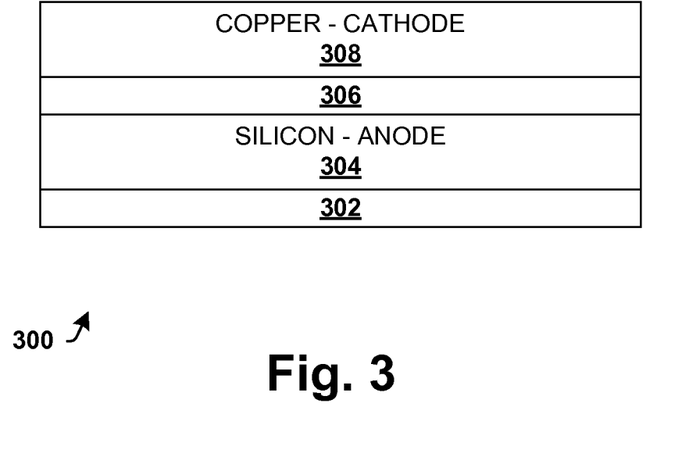
FIG. 3 is a cross sectional view illustrating a silicon battery that can be utilized with a self powered memory system.

FIG. 3 is a cross sectional view illustrating a silicon battery 300 that can be utilized with a self powered memory system. The battery 300 is provided as an example and it is appreciated that suitable variations are permitted. The battery 300 can be utilized for the battery component 110, described above.

The battery includes a backside metal 302, an anode 304, a separator 306, and a cathode 308. The backside metal 302 is formed on a backside of the anode 302. The backside metal 302 is, in one example, comprised of copper. The anode 304 is comprised of a semiconductor material, which in this example, is silicon. The anode 304 serves as the negative electrode.

The cathode 308 is comprised of a suitable material, such as copper in this example, to provide stored energy in conjunction with the separator 306 and the anode 304. The separator 306 is between the cathode 308 and the anode 304. In one example, the separator 306 is comprised of a stack of layers.

The battery 300 is configured to have selected or desired battery characteristics. The characteristics should match a desired application.

In one example, the characteristics include a capacity of 12 mAh, a voltage of 3.6 to 4 Volts, a peak load of 1.5 mA, and an efficiency greater than 92 percent in second charging/discharging cycles.

As an example, a RAM module configured with data has an assumed average 1 micro amp leakage current and limited to 83 percent discharge, which equals a difference or delta of 10 mAh. These features vary depending on factors such as technology and temperature. As a result, a backup time for the RAM module of 10 mAh would provide 10 mAh/0.001 mA=10,000 h. Thus, the battery 300 would suitably provide the 10,000 hours needed for this example as it has the capacity of 12 mAh, which exceeds the mAh.

Figure 4:
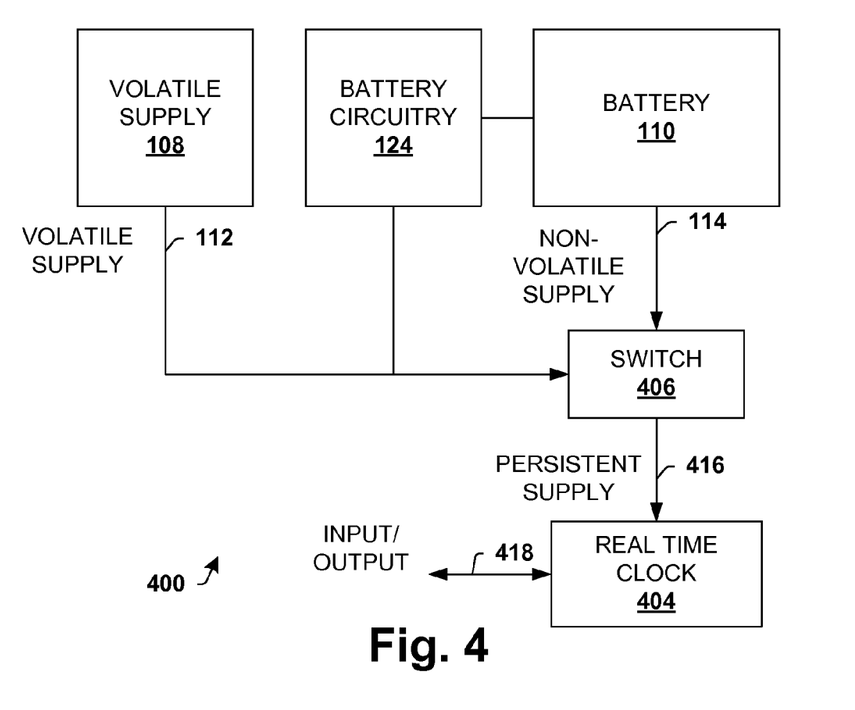
FIG. 4 is a block diagram illustrating a self powered real time clock system.

FIG. 4 is a block diagram illustrating a self powered real time clock system 400. The system 400 uses its own power to maintain real time clock information without use of non-volatile memory. The system 400 is similar in operation to system 100. The like identified components can be referenced above for further details. The system 400 can be utilized for applications requiring time based tracking of information or logging. The applications can include, for example, safety critical applications, air bag applications, and the like. The system 400 is included on a single chip and/or die.

The system 400 includes a volatile or main supply 108, battery circuitry 124, a battery component 110, a switch component 406, and a real time clock component 404. The volatile supply 108, the battery circuitry 124, and the battery component 110 work as described above.

The switch component 406 operates substantially similar to the switch component 106, described above. The switch component 406 provides a persistent supply 416 to the real time clock component by switching from the volatile supply 112 to the non-volatile supply 114 on the volatile supply being unavailable or insufficient. The non-volatile supply 114 is on chip with the real time clock component whereas the volatile supply 108 can be off chip.

The real time clock component 404 includes a memory, such as the volatile memory 104, for storing real time information. The real time clock component 404 also includes an oscillator for maintaining real time. By utilizing the persistent supply, the real time clock component 404 is able to maintain its clock even when the volatile supply 106 is off. Further, the real time clock component 404 is also configured to maintain real time information 418.

The real time clock component 404 transfers the real time information 418 with other components, typically via a bus. The real time information can include time stamps, current time, and logged information.

Figure 5:
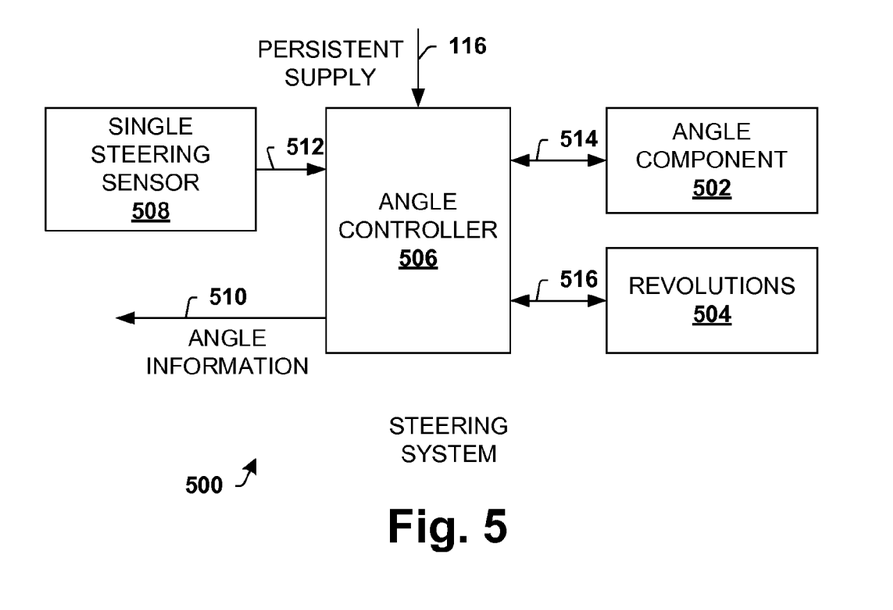
FIG. 5 is a block diagram illustrating a self powered angle sensor system.

FIG. 5 is a block diagram illustrating a self powered angle sensor system 500. The system 500 utilizes persistent power in order to use only a single sensor for monitoring a steering angle.

A steering angle in automotive systems is based on degrees and revolutions. Other systems require multiple sensors to track a steering wheel angle, from 0 to 360 degrees, and a number of revolutions and a direction of revolutions.

The system 500 includes a current angle component 502, a revolutions component 504, an angle controller 506, and a single steering sensor 508. The steering sensor 508 provides steering information 512 to the angle controller 506. The steering information includes an amount of change, possibly in degrees, and a direction, such as positive or negative. For example, the steering information 512 could include +5 degrees which indicates turning of a steering wheel 5 degrees in a positive (+) or clockwise direction. In another example, the steering information 512 could include −20 degrees, which indicates turning of a steering wheel 10 degrees in a negative (−) or counter clockwise direction.

The angle controller 506 receives the steering information 512 and provides angle information 510. The angle information 510 is based on an angle and revolutions and identifies a direction of a vehicle.

The current angle component 502 maintains a current angle 514 and a revolutions component 504 maintains a current revolution 516. The angle controller 506 updates 502 and 504 based on the steering information 512. Thus, when a full revolution of steering has occurred, the controller 506 can increment the revolutions 516 stored in the revolutions component 504.

The angle controller 506 determined the angle information 510 from the current angle 514 and the current revolutions 516 as equal to the current revolutions 516 times 360 degrees plus the current angle 514.

At least the angle controller 506, the angle component 502 and the revolutions component 504 are powered by a persistent supply 116. As a result, the angle information 510 of a steering wheel can be maintained, even if a main supply is off, such as when an auto is turned off.

Figure 6:
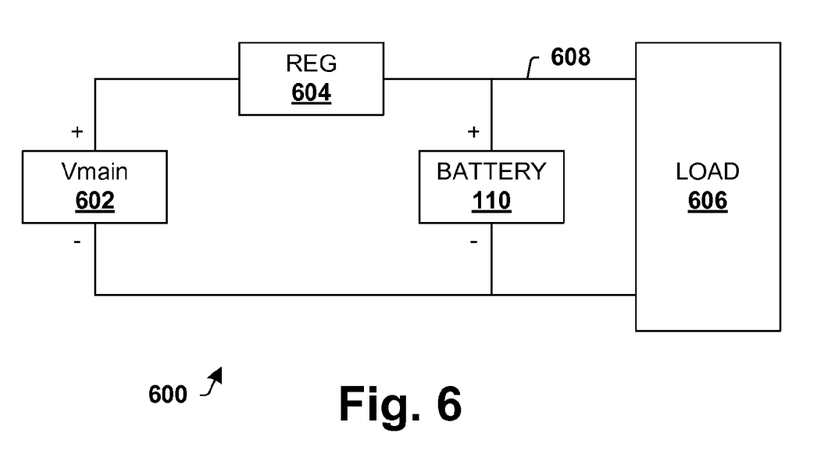
FIG. 6 is a diagram of a system having an integrated battery component to operate as a power buffer.

FIG. 6 is a diagram of a system 600 having an integrated battery component to operate as a power buffer. The system 600 is provided in a simplified format in order to aid understanding.

A power source for a system can have periods of intentional or unintentional lapses in sufficient power. This could be due, for example, to an unintentional system power fluctuation leading to power being cut off or provided at a lower than suitable current and/or voltages due to transitional effects on the supply lines due to electromagnetic coupling effects of systems operating in parallel. Alternately, the power may be intentionally reduced due to an interface requirement and/or other specification. For example, a two-wire interface sharing power supply and data communication on the same line could imply a conscious voltage reduction during the data transmission phase. At least some of the system components, such as a sensor or memory, may still need full or suitable power during this phase.

The system 600 includes a main power supply 602, a voltage regulation component 604, a battery component 110, and a load 606. The main power supply 602 provides a volatile supply that can vary intentionally or unintentionally over time. At some time, the volatile supply provided by the supply 602 can fall below threshold value(s) for the load 606. The system 600 is typically integrated into a single chip.

The load 606 is a system component such as a memory, sensor, controller, and the like. The load 606 has minimum power needs, in terms of current and/or voltage required for operation. These minimum power needs are reflected in the threshold values.

The voltage regulation component 604 regulates the volatile supply from the main supply 602. The battery component 110 buffers the output of the voltage regulation component 604 so that the load 606 receives a compensated supply 608. The compensated supply 608 is at or above the threshold value(s) for the load 606.

Figure 7:
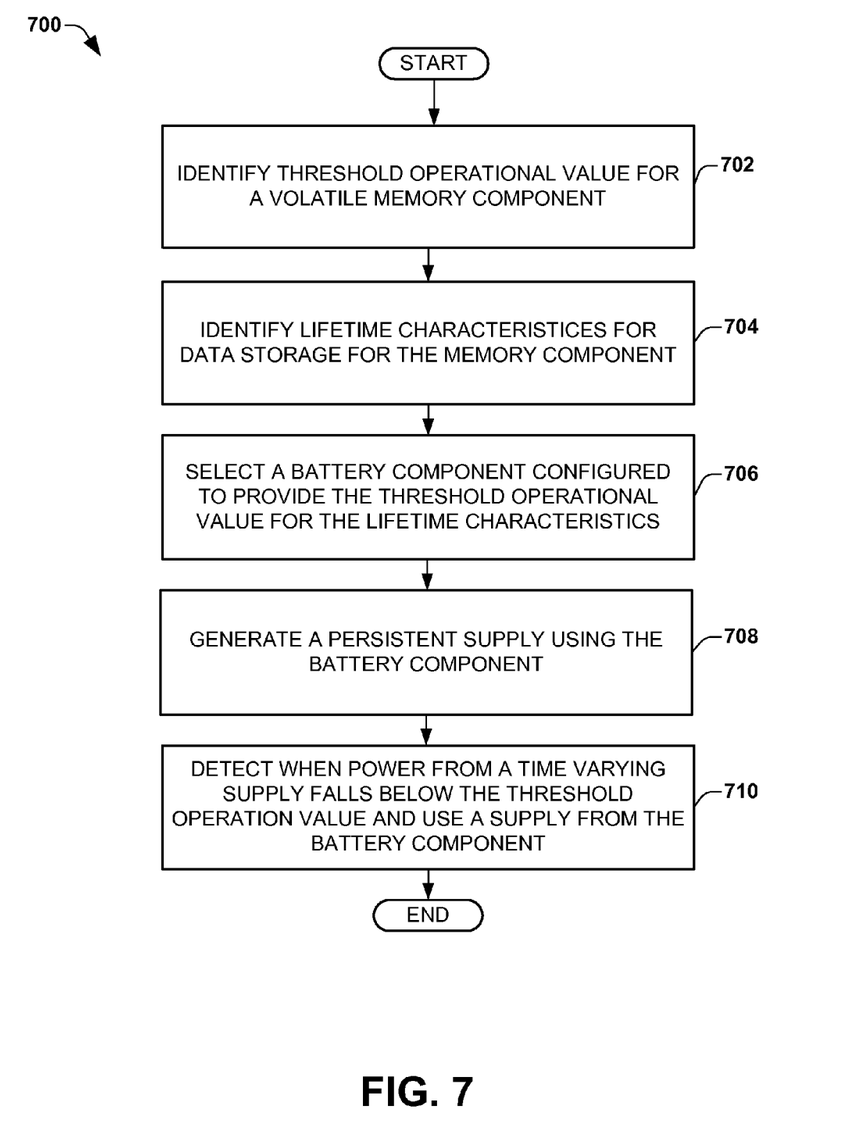
FIG. 7 is a flow diagram illustrating a method of providing persistent memory using an integrated battery.

FIG. 7 is a flow diagram illustrating a method 700 of providing persistent memory using an integrated battery. The method 700 identifies operational requirements for a volatile memory and selects a battery component based on the requirements. Then, the battery component is utilized to buffer or supplement power to the volatile memory when a main, volatile supply is unavailable.

The method 700 begins at block 702, wherein threshold operational value(s) are identified for a volatile memory component. The operational values include voltage, peak load current, efficiency and the like. The volatile memory component can include, for example, dynamic random access memory (DRAM), random access memory (RAM), static random access memory (SRAM) and the like. In one example, the volatile memory component includes 6 transistor SRAM structures based on feedback CMOS inverter structures (2×2 transistors).

Lifetime characteristics are identified for the volatile memory component at block 704. The lifetime characteristics pertain to the ability to maintain data in the volatile memory using only a battery component. The lifetime characteristics can include years of backup operation, a number of cycles, battery capacity (i.e., Amp Hours), and the like.

A battery component is selected at block 706. The battery component is selected according to the lifetime characteristics and the identified threshold operation value. In one example, the selected battery component is a silicon based battery formed in a semiconductor substrate.

A persistent power supply is generated using the battery component at block 708. The persistent supply maintains power levels to the volatile supply at the identified threshold operational value(s).

A time varying or volatile supply from a main supply is monitored at block 710. The time varying supply is generally used to power the volatile memory. On the time varying supply falling below the threshold operation value(s), power from the battery component is used to supplement or replace power to the volatile memory component. The power from the battery component is referred to as a non-volatile supply.

It is appreciated that the above method and variations thereof can be combined and utilized interchangeably. Additionally, the method can be utilized with the systems and components described above.

While the above methods are is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A self powered memory system is disclosed. The system includes a volatile supply component, a battery component, a switch component, and a volatile memory component. The volatile supply component is configured to provide a time varying supply. The battery component is configured to generate a non-volatile supply. The switch component is configured to generate a persistent supply from the time varying supply and the non-volatile supply. The volatile memory component is configured to maintain data by using the persistent supply.

Another self powered system includes a volatile supply component, a battery component, a switch component, battery circuitry, and a component. The volatile supply component is configured to provide a time varying supply. The battery component is configured to generate a non-volatile supply as needed. The switch component is configured to generate a persistent supply from the time varying supply and the non-volatile supply. The battery circuitry is configured to monitor the non-volatile supply and to utilize the time varying supply to charge the battery component. The component is configured to operate using the persistent supply when the time varying supply is at insufficient power levels.

A method of operating a self powered memory is disclosed. A threshold operational value for a volatile memory component is identified. Lifetime characteristics for data storage for the volatile memory component are identified. A battery component is selected and/or configured to provide power according to the threshold operational value and the lifetime characteristics. The selected battery component is used to generate a persistent supply for the volatile memory component. The persistent supply provided by the battery component meets the threshold operational value and the lifetime characteristics requirements.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A self powered memory system comprising:
    a volatile supply component configured to provide a time varying supply potential;
    a battery component configured to generate a non-volatile supply potential;
    a switch component configured to generate a persistent supply potential from the time varying supply potential and the non-volatile supply potential; and
    a volatile memory component configured to maintain data by using the persistent supply potential based on the non-volatile supply potential for an entirety of the duration of time when the time varying supply potential is unavailable.

2. The system of claim 1, wherein the time varying supply potential is OFF for the entirety of the duration of time.

3. The system of claim 1, wherein the time varying supply potential includes time periods where power is below a threshold value where the system is operational.

4. The system of claim 1, wherein the battery component includes a silicon based battery.

5. The system of claim 4, wherein the silicon based battery includes a copper anode, a separator, and a silicon anode and is positioned on a single die with the volatile memory component.

6. The system of claim 1, wherein the battery component is configured to generate the non-volatile supply potential for a minimum defined backup time, where the backup time is a period of time the time varying supply potential is at a power level below the operational supply for the system or about zero.

7. The system of claim 1, wherein the switch component includes a first element directionally coupling the battery component to the volatile memory component and a second element directionally coupling the volatile supply component to the volatile memory component.

8. The system of claim 1, wherein the switch component is configured to utilize the non-volatile supply potential to buffer the persistent supply when the time varying supply potential is at a power level below a threshold for operation the volatile memory component.

9. The system of claim 1, wherein elements in the switching component additionally perform active switching control for diagnostic and failsafe operation.

10. The system of claim 1, wherein the volatile memory component includes a 6 transistor synchronous random access memory.

11. The system of claim 1, further comprising battery circuitry configured to monitor the non-volatile supply potential and charge the battery component.

12. The system of claim 11, further comprising read/write logic configured to transfer data with the volatile memory component.

13. A self powered system comprising:
    a volatile supply component configured to provide a time varying supply potential;
    a battery component configured to generate a non-volatile supply potential as needed;
    a switch component configured to generate a persistent supply potential from the time varying supply potential and the non-volatile supply potential;
    battery circuitry configured to monitor the non-volatile supply potential and to utilize the time varying supply potential to charge the battery component; and a component configured to operate using the persistent supply potential based at least partially on the non-volatile supply potential for an entirety of the duration of time when the time varying supply potential is below a threshold value.

14. The system of claim 13, wherein the component is an integrated real time clock configured to log information in real time.

15. The system of claim 13, further comprising a second component configured to operate using the persistent supply potential.

16. The system of claim 15, wherein the component is an angle component configured to store steering angle information and the second component is a revolution component configured to store steering revolutions information.

17. The system of claim 16, further comprising an angle controller coupled to the angle component and the revolution component and configured to generate steering information from the steering angle information and the steering revolutions information.

18. The system of claim 13, wherein the switch component utilizes the non-volatile supply potential to buffer the time varying supply potential.

19. A method of operating a self powered memory, the method comprising:
- identifying a threshold operational value for a volatile memory component;
- identifying lifetime characteristics for data storage for the volatile memory component;
- selecting a battery component configured to provide the threshold operational value for the lifetime characteristics; and
- using the battery component to generate a persistent supply potential for the volatile memory component by supplementing a time varying supply potential with a battery potential.

20. The method of claim 19, wherein using the battery component to generate the persistent supply potential comprises detecting when power from a time varying supply potential falls below the threshold operational value.

* * * * *